(12) United States Patent
Auerswald et al.

(10) Patent No.: US 6,940,136 B2
(45) Date of Patent: Sep. 6, 2005

(54) CIRCUIT ARRANGEMENT WITH SEMICONDUCTOR ELEMENTS ARRANGED IN CHIPS

(75) Inventors: Gerd Auerswald, Neuhof A.D. Zenn (DE); Gunter Ludwig, Schwarzenbruck (DE)

(73) Assignee: Siemens Aktiengesellschaft, Munich (DE)

( * ) Notice: Subject to any disclaimer, the term of this patent is extended or adjusted under 35 U.S.C. 154(b) by 136 days.

(21) Appl. No.: 10/623,947

(22) Filed: Jul. 21, 2003

(65) Prior Publication Data
US 2004/0016985 A1 Jan. 29, 2004

Related U.S. Application Data

(63) Continuation of application No. PCT/DE02/00105, filed on Jan. 16, 2002.

(30) Foreign Application Priority Data

Jan. 19, 2001 (DE) .......................................... 101 02 359

(51) Int. Cl.[7] .............................................. H01L 29/76
(52) U.S. Cl. ...................................... 257/401; 257/712
(58) Field of Search .................................. 257/288, 401, 257/712

(56) References Cited

U.S. PATENT DOCUMENTS

| | | | | |
|---|---|---|---|---|
| 4,246,697 A | * | 1/1981 | Smith ........................... | 29/827 |
| 4,458,305 A | | 7/1984 | Buckle et al. ............... | 363/141 |
| 4,783,697 A | * | 11/1988 | Benenati et al. ............. | 257/584 |
| 5,767,573 A | | 6/1998 | Noda et al. .................. | 257/675 |
| 6,462,364 B1 | * | 10/2002 | Horiuchi ....................... | 257/288 |
| 6,843,335 B2 | * | 1/2005 | Shirakawa et al. ......... | 180/65.1 |
| 6,849,902 B1 | * | 2/2005 | Lin .............................. | 257/355 |

FOREIGN PATENT DOCUMENTS

| | | | |
|---|---|---|---|
| DE | 92 03 000.9 U1 | 3/1992 | ........... H01L/25/07 |
| DE | 100 08 582 A1 | 8/2000 | ........... H01L/25/07 |
| EP | 0 265 833 | 10/1987 | ........... H01L/23/56 |
| EP | 0 697 732 A2 | 8/1995 | ......... H01L/25/065 |
| EP | 0 987 762 A2 | 9/1999 | ......... H01L/25/065 |
| EP | 1 028 465 A2 | 2/2000 | ........... H01L/25/07 |
| EP | 1 083 599 A2 | 9/2000 | ......... H01L/23/051 |
| FR | 2 620 862 | 9/1987 | ........... H01L/23/52 |

* cited by examiner

*Primary Examiner*—Roy Potter
(74) *Attorney, Agent, or Firm*—Baker Botts L.L.P.

(57) ABSTRACT

A circuit arrangement with semiconductor elements arranged in chips is described. The circuit arrangement is characterized by at least one metal body (s1) for electrically contacting the semiconductor elements and for dissipating the heat produced by the semiconductor elements, said metal body (s1) being adapted to simultaneously function as the support for the semiconductor elements and the chips (c1) of the semiconductor elements being fastened on the body (s1).

12 Claims, 1 Drawing Sheet

CIRCUIT ARRANGEMENT WITH SEMICONDUCTOR ELEMENTS ARRANGED IN CHIPS

CROSS REFERENCE TO RELATED APPLICATION

This application is a continuation of copending International Application No. PCT/DE02/00105 filed Jan. 16, 2002 and claiming a priority date of Jan. 19, 2001, which designates the United States.

TECHNICAL FIELD OF THE INVENTION

The invention relates to a circuit arrangement with semiconductor elements arranged in chips, which can be used for example for an ISG (integrated starter generator) module in a motor vehicle.

BACKGROUND OF THE INVENTION

The manufacture of circuit arrangements in hybrid technology is known. In such arrangements chips with semiconductor elements are attached directly without a chip housing to a ceramic carrier in which current tracks are arranged.

The disadvantage of such a circuit arrangement is on one hand that it is expensive because of the ceramic carrier. On the other hand such a circuit arrangement is not suitable as a power module for very high currents, e.g. 300 Amperes, since the current tracks arranged in a ceramic carrier cannot conduct such high currents.

SUMMARY OF THE INVENTION

The object of the invention is to specify a circuit arrangement with the semiconductor elements arranged in chips which is both lower cost and suitable for very high currents when compared to the prior art.

The object can be achieved by a circuit arrangement with semiconductor elements arranged in chips and with at least one metallic body for electrical conducting of the semiconductor elements and for dispersing and dissipating the heat generated in the conductor elements. The metallic body or bodies are defined in such a way that the metallic body or bodies simultaneously act as carriers for the semiconductor elements. The chips are fastened to the body or bodies.

For example, a circuit arrangement comprises a plurality of semiconductor elements, at least one metallic body for electrical contacting of the semiconductor elements and for dissipation of the heat generated in the semiconductor elements, whereby the metallic body or bodies are designed in such a way that the metallic body or bodies simultaneously serve as carriers for the semiconductor elements, and the semiconductor elements are fastened to the metallic body or bodies, first semiconductor elements of the semiconductor elements which are switched in parallel, a first body of the at least one metallic body to which the first semiconductor elements are fastened, at least a first metallic bus body as a terminal for a control module, control connections of the first semiconductor elements which are electrically connected to the first bus body by means of bond wires, second semiconductor elements of the semiconductor elements which are switched in parallel, a second body of the at least one metallic body to which the second semiconductor elements are fastened and which is arranged next to the first body, a second metallic bus body as a terminal for the control module, and control terminals of the second semiconductor elements which are connected to the second bus body by means of bond wires.

The semiconductor elements can be electrically connected to the body or bodies such that the semiconductor elements are fastened directly without housing to the body or bodies. The semiconductor elements can be connected to the associated body in each case by conductive adhesive or by solder. To dissipate the heat generated in the semiconductor elements, the body or bodies can be arranged on a cooling device electrically isolated from the body or bodies. A third metallic bus body can be provided as a ground connection, and at least a terminal of the semiconductor elements can be connected to the third bus body with the aid of a bond wire. The body or bodies and/or the first bus body and/or the second bus body and/or the third bus body can be substantially made of copper.

The object can further be achieved by a method of manufacturing a circuit arrangement comprising the steps of:

providing a plurality of semiconductor elements,
providing a cooling body;
arranging at least a first metallic body on said cooling body to which first semiconductor elements of said semiconductor elements are fastened,
arranging at least a first metallic bus body on said cooling body as a terminal for a control module,
coupling control connections of the first semiconductor elements to the first bus body by means of bond wires,
arranging at least a second metallic body next to the first body to which second semiconductor elements of said semiconductor elements are fastened,
arranging a second metallic bus body as a terminal for the control module, and
connecting control terminals of the second semiconductor elements to the second bus body by means of bond wires.

The method may further comprise the step of providing an insulating layer between said cooling body and said metallic bodys. The method may further comprise the step of connecting the semiconductor elements electrically to the body or bodies such that the semiconductor elements are fastened directly without housing to the body or bodies. The method may further comprise the step of connecting the semiconductor elements to the associated body in each case by conductive adhesive or by solder. The method may further comprise the step of arranging a third metallic bus body as a ground connection on top of one of said metallic bodies, and the step of connecting at least a terminal of the semiconductor elements to the third bus body with the aid of bond wires.

The bodies simultaneously serve as carriers and as electrical lines. The chips are fastened mechanically to the bodies so as to produce an electrical connection between the chips and the bodies. Expensive ceramics is not used for the chip carrier which means that the circuit arrangement can be particularly low cost.

Since the bodies are not conductor tracks arranged in the substrate they can have a larger cross section and thereby transport high currents. The circuit arrangement is consequently suitable for very high currents.

This is particularly the case when the semiconductor elements are electrically connected to the body or bodies so that the chips of the semiconductor elements can be fastened directly to the body or bodies without a chip casing. No additional connecting lines between the bodies and the semiconductor elements arranged on them, e.g. in the form of fins projecting from a chip casing, are required, which would limit the maximum possible current strength. The direct arrangement of the chips on the bodies makes the electrical contact between the semiconductor elements and the bodies. A circuit arrangement of this type has the additional advantage of only requiring a small space since the chips do not have any chip casings.

A chip of a semiconductor element through which heavy current is to flow can however also be accommodated in a chip casing of which the back consists of the metal plate which is directly fastened to the body. The semiconductor element is located on the metallic plate of the chip casing.

Chips of semiconductor elements through which only weak currents have to flow can also be arranged in casings which for example are connected to the body or bodies by fins.

In addition to the connection provided for the bodies of the semiconductor element other connections of the semiconductor elements can be provided, contacted for example by bond connections.

The material of the body or bodies and the material of the chips preferably features similar thermal expansion coefficients so that to reduce the space requirement for the circuit arrangement the chip casings can be dispensed with without temperature variations leading to mechanical stress.

If the chips are arranged directly on the body or bodies or if the chips feature chip housings the rear of which are formed by a metallic plate, the heat generated in the semiconductor elements is dissipated particularly well since metallic material and thereby the bodies have a high heat dissipation capability and good heat dispersion.

The chips without chip casings or with chip casings the rear of which is formed by metallic plates are each fastened to the relevant body by a conductive adhesive or solder for example.

A cooling device on which the bodies are located is preferably provided to dissipate the heat generated in the semiconductor elements. In this case the bodies are electrically isolated from the cooling device. The isolation can for example be implemented by placing a commercially-available heat dissipation foil between the bodies and the cooling device.

The bodies are preferably designed to be so stable that they didn't fracture before being arranged on the cooling device.

The cooling device typically consists of a metallic block with good thermal conductivity which is cooled by air or water.

To conduct a high current a number of semiconductor elements of preferably connected with the same output terminal of the circuit arrangement. The output terminal is typically electrically connected to a first metallic body. The first of the semiconductor elements are mechanically and conductively fastened to the first metallic body.

The first semiconductor elements can for example be switched in parallel.

The circuit arrangement can feature power semiconductor elements and/or normal electronic components. The circuit arrangement can for example be a power module.

In this case it is advantageous to provide at least one metallic bus body as a connection for a control module. In this case control terminals of the first semiconductor and elements are connected with the aid of bond wires to a first bus body. To connect the control module to the first semiconductor elements it is sufficient to place a single electrical connection between the control module and the first bus body. Connection of the control module to each of the first semiconductor elements is no longer required. The connection between the control module and the power module thus has a clear and simple design. In addition the functionality of the power module can be checked independently of its connection to the control module since a test device can control the first semiconductor element by being connected to the first bus body. Otherwise a confusingly large number of semiconductor elements would have to be connected to the test device. This also simplifies repair of an arrangement consisting of a power modules and a control module connected to it since with a fault in the control module this can be easily disconnected from the power module by separating the connection to the first bus body, repaired or exchanged. The new bonding of the many chips to connect with a repaired control model is not required. In addition the first semiconductor elements connected in parallel can be activated with a higher current strength since the bus bodies have a much larger cross-section than the electrical lines on a circuit board. Activation with a high current strength is advantageous for stress tests for example to detect weak points in the power module. The first bus body can be manufactured simultaneously with of the bodies.

Instead of a bus body However the conductor track integrated for example into a carrier designed as a circuit board can also be provided.

The power module can for example feature a further output terminal. The further output terminal is electrically connected with a second metallic body. The semiconductor elements include the second semiconductor elements which are switched in parallel and are attached to the second body. A second metallic bus body is provided as the connection for the control module. Control connections of the second semiconductor elements are connected with the aid of bond wires to the second bus body.

As the basic connection it is advantageous to provide a third metallic bus body. Terminals of the semiconductor elements can be connected with the aid of bond wires to the third bus body.

Copper is particularly suitable as material for the bodies or the bus bodies. Other metals or alloys can also used however. The bodies or bus bodies can also consist of layers of different metals. The bodies or bus bodies can for example also consist mainly of copper as well as a metallic oxidization layer, of nickel for example.

The bodies or the bus bodies can be in the form of bars. Alternatively the body or bus body can be in form of a plate or a structured plate.

The bodies or bus bodies can for example be punched from sheet metal, sawn or eroded. A cutting procedure using a laser is also possible.

To have a fixed relative arrangement of the bodies or bus bodies right at the beginning of the manufacturing process it is advantageous to produce all bodies and bus bodies from the same metal and in doing so to leave thin bars between the bodies or bus bodies. After arrangement on a cooling device for example the bars can be removed. Alternatively the finished bodies or bus bodies can be connected to each other using plastic injection molding by plastic bars which do not then have to be removed again for the finished circuit arrangement.

BRIEF DESCRIPTION OF THE DRAWINGS

An exemplary embodiment is described below in more detail with reference to the figures.

DETAILED DESCRIPTION OF THE PREFERRED EMBODIMENTS

Figure 1:
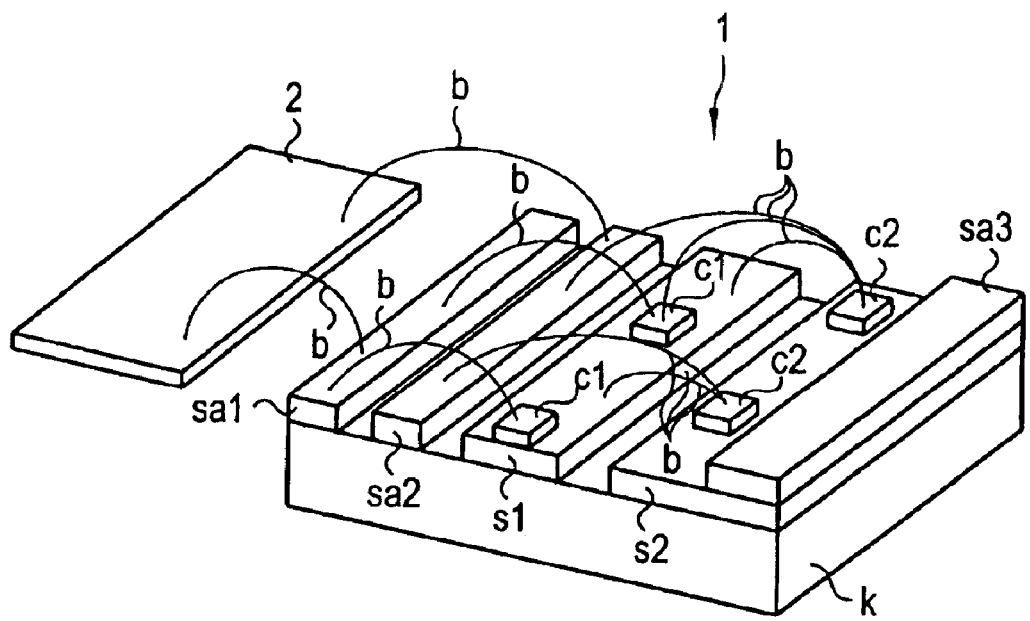
FIG. 1 shows a three-dimensional representation of a power module with a first body, a second body, a first bus body, a second bus body, a third bus body, first power semiconductor elements, second power semiconductor elements, a cooling device and bond wires. The power module is connected via electrical lines to a control module.

In the exemplary embodiment a power module one is provided that features power semiconductor elements arranged in chips c. The power semiconductors comprise the first power semiconductor elements and second power semiconductor elements (see FIG. 1).

The first power semiconductor elements are switched in parallel. The bare chips c1 of the first power semiconductor elements are fastened with the aid of a conductive adhesive to a first body s1 designed as a copper bar. this means that the first power semiconductor elements are electrically connected to the first body s1. An output terminal of power module 1 is arranged on the first body s1.

The second power semiconductor elements are connected in parallel. The bare chips c2 of the second power semiconductor elements are fastened with conductive adhesive to a second body S2 made of copper and designed as a bar. A terminal of power module 1 which is kept at a constant 36V is arranged on the second body s2.

The first body s1 and the second body s2 are located next to each other, around 8 mm wide and around 2 mm high.

A first bar-shaped bus body sa1 and a second bar-shaped bus body sa2 made of copper are located next to the first body s1. Control connections of the first power semiconductor elements are connected with the aid of bond wires b to the first bus body sa1. Control connections of the second power semiconductor elements are connected with the aid of bond wires b to the second bus body sa2. The first bus body sa1 and the second bus body sa2 serve to connect the power module 1 to a control module 2.

A third bar-shaped bus body SA3 made of copper and electrically isolated from the second body s2 is arranged above the second body s2. The third bus body sa3 serves as a connection to ground potential. Terminals of the first power semiconductor elements and the second power semiconductor elements are connected to the third bus body sa3 with the aid of bond wires b.

Figure 2:
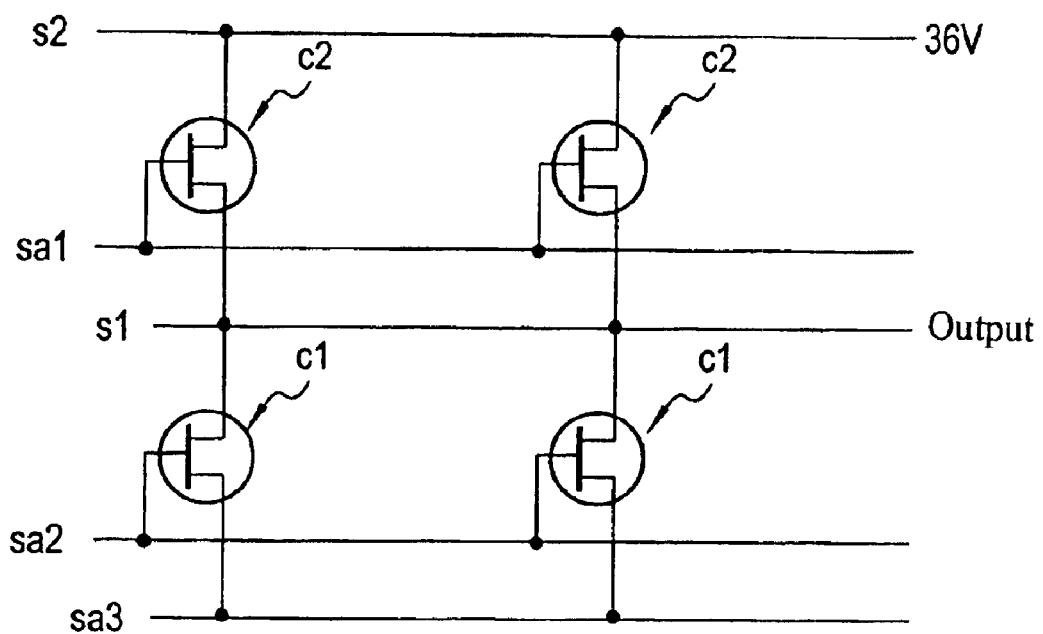
FIG. 2 shows a circuit diagram of the par module.

The first power semiconductor elements operate as a low-side driver. The second power semiconductor elements operate as a high-side driver. A pair, consisting of he first power semiconductor element and a second power semiconductor element in each case form a push-pull end stage (see FIG. 2).

The first bus body sa1, the second bus body sa2 the first body s1 and the second body s2 are arranged on a cooling device k. The cooling device k consists of a metallic block and is air-cooled or water-cooled. For electrical isolation of cooling device k from bus bodies sa1, sa2 and bodies s1, s2 an isolating heat dissipation foil (not shown) is located between the cooling device and the bus bodies sa1, sa2 or the bodies s1, s2.

We claim:

1. Circuit arrangement with semiconductor elements arranged in chips comprising:
   at least one metallic body for electrical contacting of the semiconductor elements and for dissipation of the heat generated in the semiconductor elements, whereby the metallic body or bodies are designed in such a way that the metallic body or bodies simultaneously serve as carriers for the semiconductor elements, and the chips are fastened to the metallic body or bodies, and wherein the semiconductor elements comprise first semiconductor elements which are switched in parallel,
   the body or bodies include a first body to which the chips of the first semiconductor element are fastened,
   at least a first metallic bus body is provided as a terminal for a control module,
   the control connections of the first semiconductor elements are electrically connected to the first bus body with the aid of bond wires,
   the semiconductor elements include second semiconductor elements switched in parallel,
   the body or bodies include a second body to which the chips of the second semiconductor element are fastened and which is arranged next to the first body,
   a second metallic bus body is provided as a terminal for the control module, and
   the control terminals of the second semiconductor elements are connected to the second bus body with the aid of bond wires.

2. Circuit arrangement in accordance with claim 1, wherein
   the semiconductor elements are electrically connected to the body or bodies so that the chips of the semiconductor elements are fastened directly without a chip housing to the body or bodies.

3. Circuit arrangement in accordance with claim 1, wherein
   the chips of the semiconductor elements are connected to the associated body in each case by conductive adhesive or by solder.

4. Circuit arrangement in accordance with claim 1, wherein
   to dissipate the heat generated in the semiconductor elements the body or bodies is or are arranged on a cooling device electrically isolated from the body or bodies.

5. Circuit arrangement in accordance with claim 1, wherein
   a third metallic bus body is provided as a ground connection, and
   the terminals of the semiconductor elements are connected to the third bus body with the aid of bond wires.

6. Circuit arrangement in accordance with claim 1, wherein
   the body or bodies and/or the first bus body and/or the second bus body and/or the third bus body are substantially made of copper.

7. Circuit arrangement comprising:
   a plurality of semiconductor elements,
   at least one metallic body for electrical contacting of the semiconductor elements and for dissipation of the heat generated in the semiconductor elements, whereby the metallic body or bodies are designed in such a way that the metallic body or bodies simultaneously serve as carriers for the semiconductor elements, and the semiconductor elements are fastened to the metallic body or bodies,
   first semiconductor elements of the semiconductor elements which are switched in parallel,
   a first body of the at least one metallic body to which the first semiconductor elements are fastened,
   at least a first metallic bus body as a terminal for a control module,
   control connections of the first semiconductor elements which are electrically connected to the first bus body by means of bond wires,
   second semiconductor elements of the semiconductor elements which are switched in parallel, a second body of the at least one metallic body to which the second semiconductor elements are fastened and which is arranged next to the first body, a second metallic bus body as a terminal for the control module, and control terminals of the second semiconductor elements which are connected to the second bus body by means of bond wires.

8. Circuit arrangement in accordance with claim 7, wherein the semiconductor elements are electrically connected to the body or bodies such that the semiconductor elements are fastened directly without housing to the body or bodies.

9. Circuit arrangement in accordance with claim 7, wherein the semiconductor elements are connected to the associated body in each case by conductive adhesive or by solder.

10. Circuit arrangement in accordance with claim 7, wherein to dissipate the heat generated in the semiconductor elements, the body or bodies is or are arranged on a cooling device electrically isolated from the body or bodies.

11. Circuit arrangement in accordance with claim 7, wherein a third metallic bus body is provided as a ground connection, and at least a terminal of the semiconductor elements is connected to the third bus body with the aid of a bond wire.

12. Circuit arrangement in accordance with claim 7, wherein the body or bodies and/or the first bus body and/or the second bus body and/or the third bus body are substantially made of copper.

* * * * *